United States Patent
Hsieh et al.

[11] Patent Number: 5,994,181
[45] Date of Patent: Nov. 30, 1999

[54] METHOD FOR FORMING A DRAM CELL ELECTRODE

[75] Inventors: Wen-Yi Hsieh, Taipei; Tri-Rung Yew, Hsinchu, both of Taiwan

[73] Assignee: United Microelectronics Corp., Taiwan

[21] Appl. No.: 08/858,398

[22] Filed: May 19, 1997

[51] Int. Cl.$^6$ .............................................. H01L 21/8242
[52] U.S. Cl. .................... 438/239; 438/243; 438/253; 438/381; 438/386; 438/396
[58] Field of Search ..................... 438/239, 253, 438/254, 381, 396, 397; 257/296, 306, 308, 309, 310

[56] References Cited

U.S. PATENT DOCUMENTS

| | | | |
|---|---|---|---|
| 5,279,985 | 1/1994 | Kamiyama | 438/396 |
| 5,396,096 | 3/1995 | Wolters et al. | 257/310 |
| 5,612,560 | 3/1997 | Chivukula et al. | 257/309 |
| 5,670,808 | 9/1997 | Nishihori et al. | 257/310 |
| 5,804,479 | 9/1998 | Aoki et al. | 438/253 |
| 5,854,104 | 12/1998 | Onishi et al. | 438/396 |

FOREIGN PATENT DOCUMENTS

| 6-29463 | 2/1994 | Japan | 257/308 |
|---|---|---|---|

Primary Examiner—Carl Whitehead, Jr.
Assistant Examiner—Toniae M. Thomas

[57] ABSTRACT

A polysilicon layer is subsequently deposited on the dielectric layer by using CVD. Next, photolithography and etching process are used to etch the doped polysilicon layer, and form a bottom electrode of DRAM cell capacitor with U shape in cross section view. The next step of the formation is the deposition of a dielectric film along the surface of the bottom electrode of DRAM cell capacitor. Typically, the dielectric film is preferably formed of high dielectric film such as tantalum oxide ($Ta_2O_5$). A conductive layer is deposited over the dielectric film. The conductive layer is used as the top storage node and is formed of titanium nitride(TiN). The methods of forming the top storage node, including sputtered-TiN, collimated-sputtering TiN, and CVD/MOCVD-TiN deposition. The purposes of sputtered-TiN and collimated-sputtering TiN processes can improve the poor step coverage of deep well of bottom electrode of DRAM cell capacitor and protect the $Ta_2O_5$ from C, Cl, F contamination during CVD/MOCVD-TiN deposition process.

20 Claims, 7 Drawing Sheets

METHOD FOR FORMING A DRAM CELL ELECTRODE

FIELD OF THE INVENTION

The present invention relates to semiconductor devices, and more specifically, to a method of making a DRAM cell having a TiN/poly-Si storage electrode.

BACKGROUND OF THE INVENTION

The reduction in memory cell area is required for high density DRAM ULSIs. This causes reduction in capacitor area, resulting in the reduction of the capacitance. A memory cell for each bit to be stored by the semiconductor DRAM typically consists of a storage capacitor and an access transistor. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits.

As DRAM devices become more highly integrated, the area occupied by a capacitor of a DRAM storage cell typically shrinks. In order to achieve sufficient cell capacitance for the scaled dynamic random access memories (DRAMs), the high dielectric constant films such as $Ta_2O_5$ and $(Ba_xSr_{1-x})TiO_3$ have been investigated extensively. In particular, $Ta_2O_5$ is just at the threshold of adoption to the DRAM capacitor. Even with the high dielectric constant films, however, simple planer stacked capacitors cannot provide a sufficient cell capacitance with the very small capacitor area of the 1 Gbit DRAM. As a result, a three-dimensional capacitor, or deep hole crown shape capacitor is required to increase the surface area. Previously, we reported a thermally robust $Ta_2O_5$ capacitor with a TiN/poly-Si storage electrode. This capacitor is highly compatible with the present DRAM processes including high temperature planarization known as borophosphosilicate glass(BPSG) flow. As mentioned above, TiN has been used as the top electrode for DRAM capacitors, especially for the ones with $Ta_2O_5$-dielectrics. The present methods of deposition of TiN layer will result in the following disadvantages: (1) for the sputtered-TiN, it has the disadvantage of poor step coverage; (2) for the TiN prepared by the metal-organic chemical vapor deposition, it has the disadvantages of high electrode resistance and poor adhesion to $Ta_2O_5$ due to high carbon concentration; and (3) it also has the possibility that the carbon with diffuse into the $Ta_2O_5$ dielectric causing the increase of leakage current. For the CVD-TiN deposited by $TaCl_4/NH_3$ or $TaF_5/H_2$, the Cl and F also have the possibility of degrading the $Ta_2O_5$ dielectric.

SUMMARY OF THE INVENTION

A dielectric layer is formed on a substrate. The dielectric layer is preferably formed of silicon dioxide. A polysilicon layer is subsequently deposited on the dielectric layer by using CVD. The polysilicon layer can be formed using doped polysilicon, in-situ doped polysilicon, or hemispherical-grained(HSG) silicon with rough surface. Next, photolithography and etching process are used to etch the doped polysilicon layer, and form a bottom electrode of DRAM cell capacitor with "U shape" in cross section view.

The next step of the formation is the deposition of a dielectric film along the surface of the bottom electrode of DRAM cell capacitor. Typically, the dielectric film is preferably formed of either a double film of nitride/oxide film, a triple film of oxide/nitride/oxide, or any other high dielectric film such as tantalum oxide ($Ta_2O_5$), BST, PZT.

A conductive layer is deposited over the dielectric film. The conductive layer is used as the top storage node and is formed of titanium nitride(TiN). The method of forming the top storage node, including following steps, first sputtering a first TiN layer over the bottom electrode of capacitor, second collimated sputtering a second TiN layer on the first TiN layer, and third CVD-deposited a third TiN layer on the second TiN layer. Additionally, as mentioned above, the sputtering-TiN process and collimated-TiN process sequence can be reversed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of forming a TiN top electrode of DRAM cell. Further, the present invention uses a doped polysilicon as a bottom electrode. As will be seen below, this technique can be used to create a capacitor with TiN/Poly-Si storage electrode. The detail processes will be described as follows.

Figure 1:
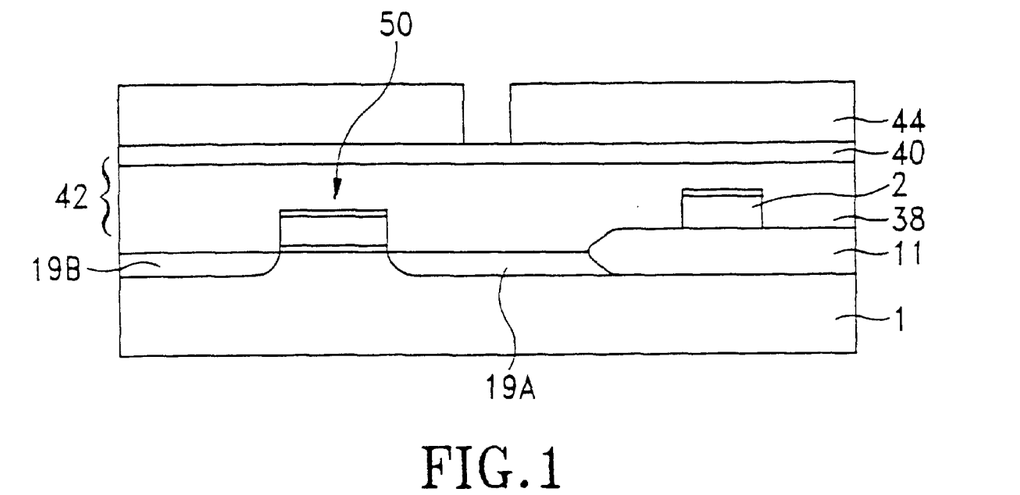
FIG. 1 is a cross section view of a semiconductor wafer illustrating the step of forming a photoresist over the substrate to define a contact hole region in accordance with the present invention.

FIG. 1 shows in cross section a fragmentary portion of a partially fabricated semiconductor device. In this embodiment, switching transistor 50 is formed on a p-type substrate 1, and an insulating film 42 is formed to cover the switching transistor 50.

The switching transistor 50, having n-type impurity diffusion layers(function as the source 19A/drain 19B), is conventionally formed on the substrate 1. In addition, a field oxide (FOX) region 11 is conventionally formed on the substrate 1 adjacent to the n-type impurity diffusion layer 19A. A word line 2 is formed on the FOX region 11. Typically, the word line 2 is made of doped polysilicon. In this embodiment, the switching transistor is an n-type MOSFET that forms a part of a dynamic random access memory (DRAM) cell. A dielectric layer such as a first oxide layer 38 is formed over the MOSFET and on the substrate 1 using a APCVD method, typically to a thickness about 9000 to 12000 angstroms. The first oxide layer 38 is then planarized by a conventional planarization method such as, for example, chemical mechanical polishing(CMP). A silicon nitride layer 40 is then deposited on the planarized first oxide layer 38 using a conventional low pressure chemical vapor deposition(LPCVD) process or a plasma-enhanced chemical vapor deposition(PECVD) process. The thickness of silicon nitride layer 40 is about 500 to 2000 angstroms.

The silicon nitride layer 40 is then planarized, via use of an etch back or other conventional planarization method such as CMP. Afterwards, conventional photolithography techniques are used to define a storage node area in a first photoresist layer 44 formed on silicon nitride layer 40. The first photoresist layer 44 is patterned to expose a portion of the silicon nitride layer 40 over the source 19A. In order to fabricate a high density DRAM, the width of the exposed portion of the silicon nitride layer 40 is chosen at or near the minimum feature size.

Figure 2:
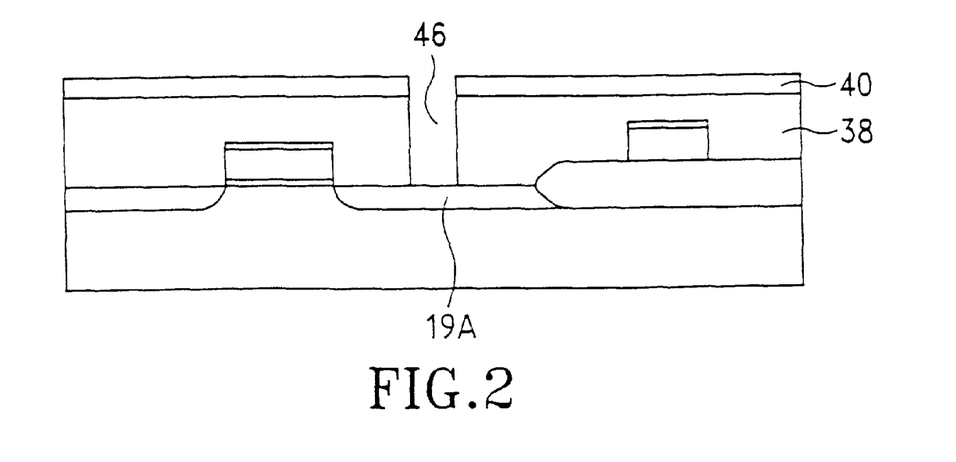
FIG. 2 is a cross section view of a semiconductor wafer illustrating the step of forming a contact hole in a dielectric layer in accordance with the present invention.

Using the first photoresist layer 44 as a mask, the silicon nitride layer 40 and the first oxide layer 38 are anisotropically etched. In this embodiment, dry etching method are used to etch the nitride by $SF_6/CHF_3$, and etch the oxide by $CHF_3/CF_4$. A contact hole 46 is thus formed in the silicon nitride layer 40 and the first oxide layer 38 as shown in FIG. 2, exposing a portion of the source region 19A.

Figure 3:
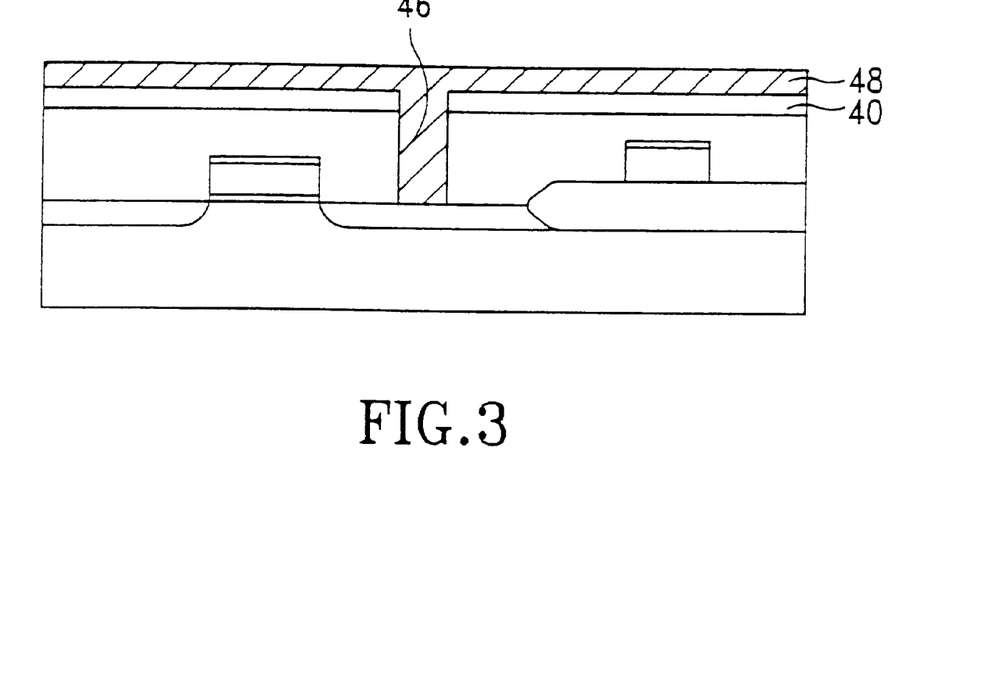
FIG. 3 is a cross section view of a semiconductor wafer illustrating the step of forming a first doped polysilicon layer on the dielectric layer and in the contact hole in accordance with the present invention.
Figure 4:
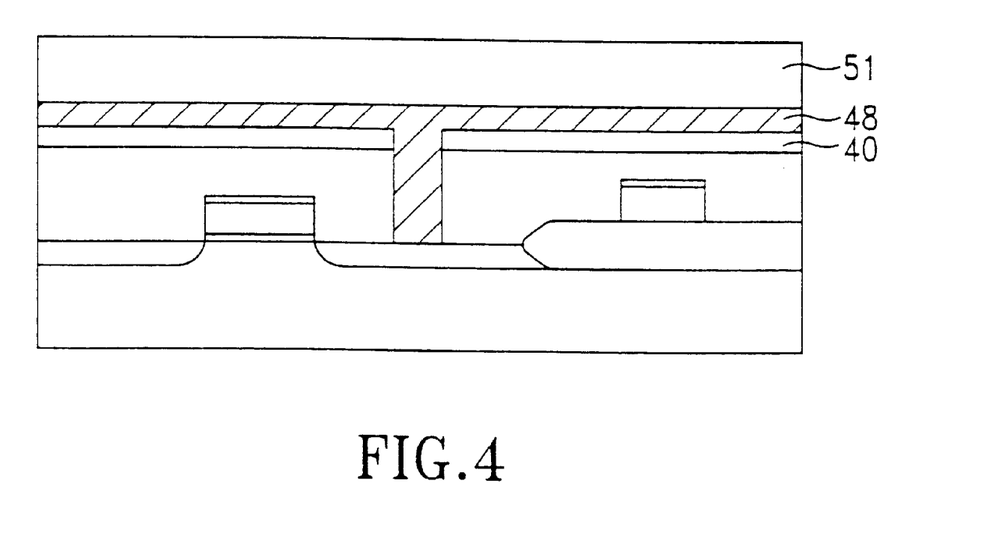
FIG. 4 is a cross section view of a semiconductor wafer illustrating the step of forming an second oxide layer on the first doped polysilicon layer in accordance with the present invention.

A first doped polysilicon layer 48, shown in FIG. 3, is formed over the silicon nitride layer 40 so as to fill the contact hole 46. The nominal thickness of the polysilicon layer 48 above the silicon nitride layer 40 is about 3000 angstroms, but can range from about 2000 to 8000 angstroms. Typically, the first doped polysilicon layer 48 is doped with phosphorus dopants at a resistivity about 35 ohm/square or less. Referring to FIG. 4, a second oxide layer 51 is deposed on the first doped polysilicon layer 48 subsquently. The thickness of the second oxide layer is between about 1000 to 8000 angstroms.

Figure 5:
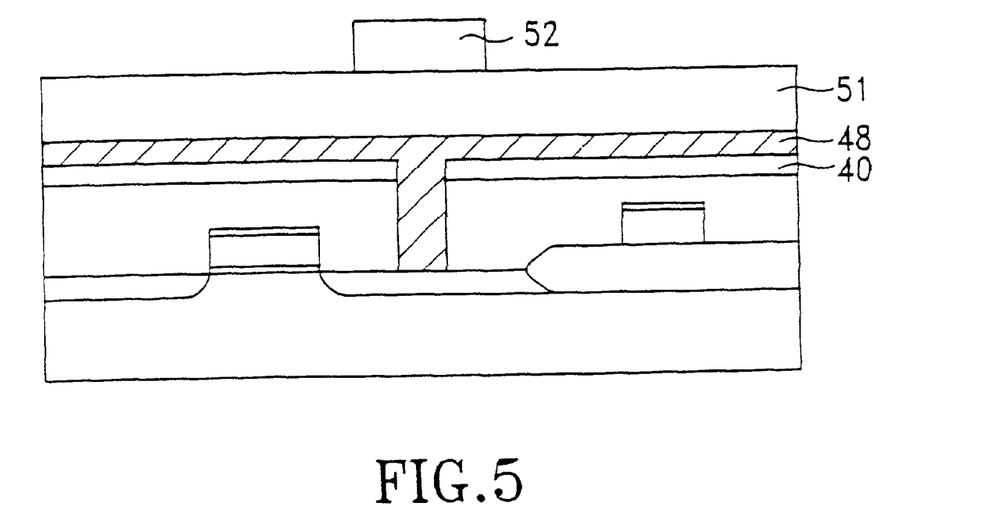
FIG. 5 is a cross section view of a semiconductor wafer illustrating the step of forming a photoresist layer on the second oxide layer in accordance with the present invention.
Figure 6:
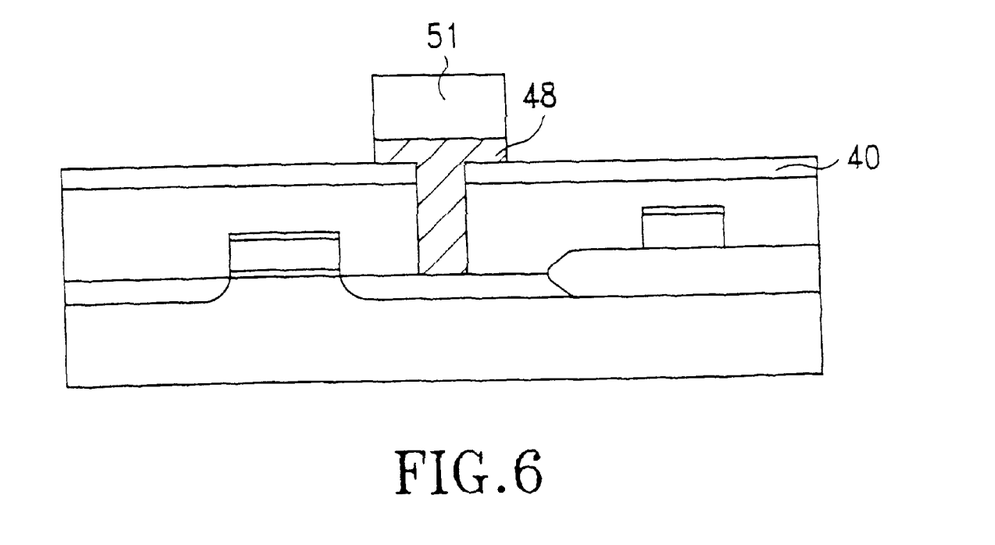
FIG. 6 to FIG. 8 show cross section views of a semiconductor wafer illustrating the various steps of forming a doped polysilicon bottom electrode in accordance with the present invention.

Referring to FIG. 5, conventional photolithography techniques are then used to form and pattern a second photoresist layer 52 on the second oxide layer 51. The first doped polysilicon layer 48 and the second oxide layer 51 are etched anisotropically, by using the second photoresist layer 52 as a mask, and the silicon nitride layer 40 serve as the etch-stop layer, as shown in FIG. 6. The second photoresist layer 52 is then removed by a conventional method.

Figure 7:
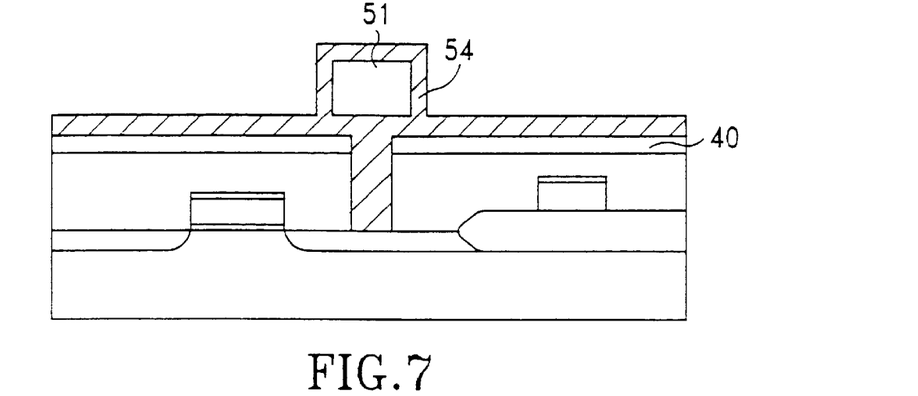
Figure 7A:
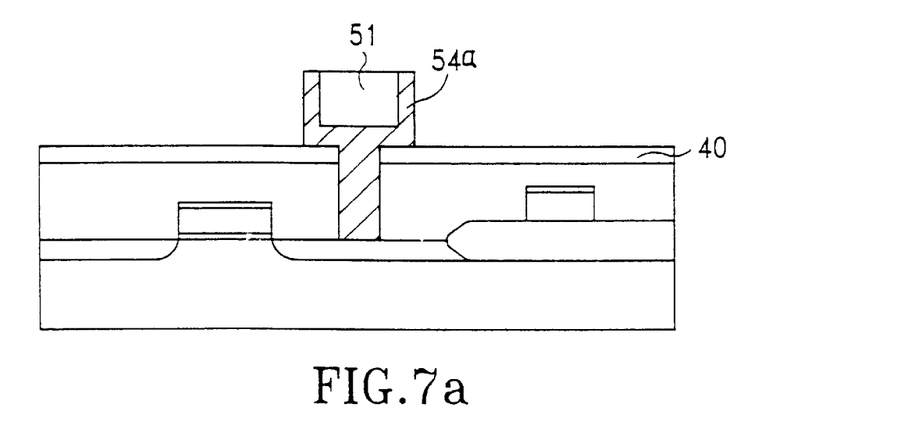

Referring to FIG. 7, a second doped polysilicon layer 54 with phosphorus dopants is conformally deposited on the second oxide layer 51 and silicon nitride layer 40. The thickness of the second doped polysilicon layer 54 is between about 1000 to 2000 angstroms. A poly-etch-back process is performed on the second doped polysilicon layer 54 to form the side wall spacers 54a on the side wall of the second oxide layer 51, the final structure is shown in FIG. 7a.

Figure 8:
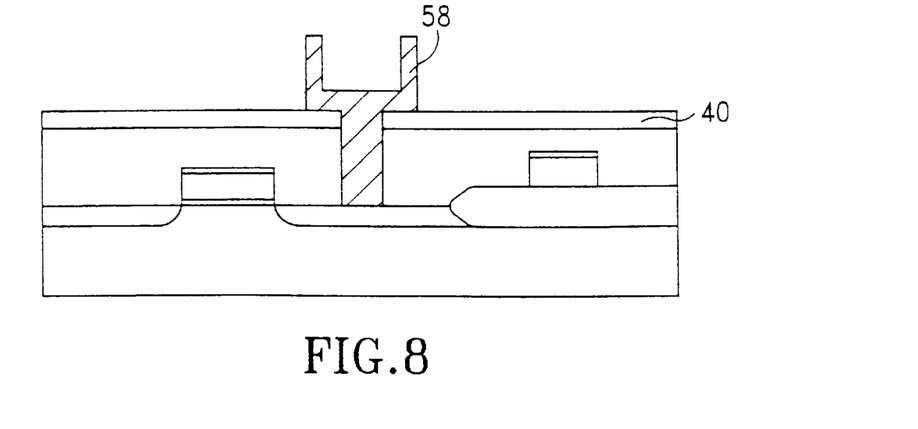

Afterwards, an oxide-dry-etching process or HF dip(stop on silicon nitride layer 40) is performed to remove the second oxide layer 51. FIG. 8 shows the resulting doped polysilicon structure, which serves as a bottom electrode 58 of DRAM cell capacitor with "U shape" in cross section view.

Figure 9:
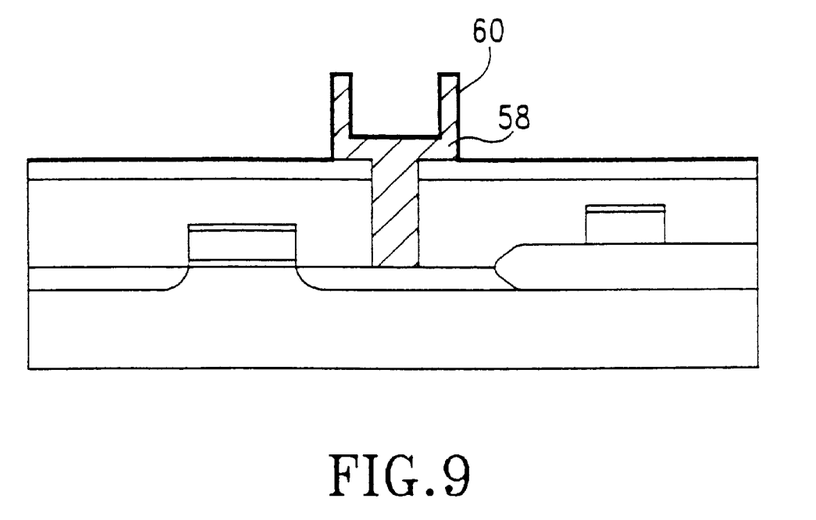
FIG. 9 is a cross section view of a semiconductor wafer illustrating the step of forming a dielectric layer along the surface of doped polysilicon layer in accordance with the present invention.

Referring to FIG. 9, the next step of the formation is the deposition of a dielectric film 60 along the surface of the bottom electrode 58 of the DRAM cell capacitor. Typically, the dielectric film 60 is preferably formed of either a nitride/oxide film, a triple film of oxide/nitride/oxide, or any other high dielectric film such as tantalum oxide($Ta_2O_5$), BST, PZT. In this embodiment, the dielectric film 60 is tantalum oxide($Ta_2O_5$), which is deposited by CVD method. The thickness of the tantalum oxide film is about 50 to 200 angstroms.

In this invention, a process including the sputter, collimated-sputtering, and chemical vapor deposition of titanium nitride(TiN) is used to form the TiN top electrode on $Ta_2O_5$ dielectric.

Figure 10A:
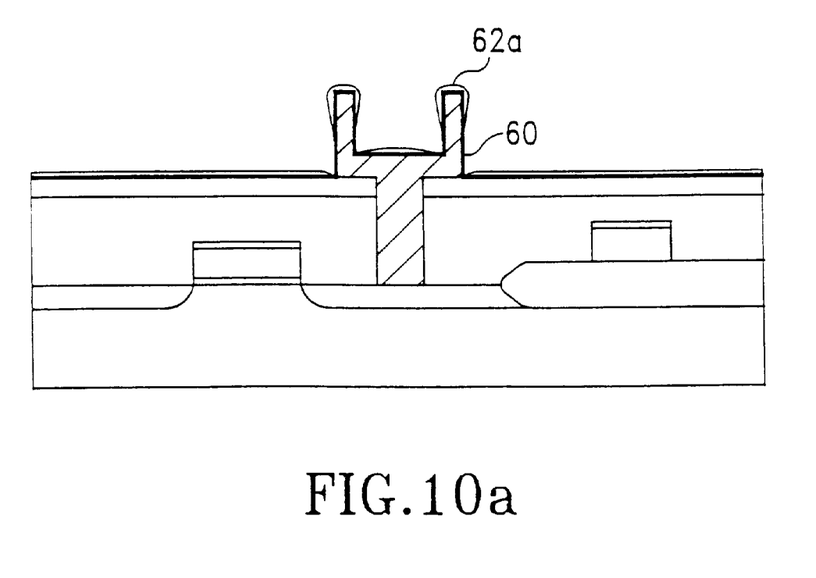
FIG. 10a is a cross section view of semiconductor wafer illustrating the step of forming a first TiN layer in accordance with the present invention.
Figure 10B:
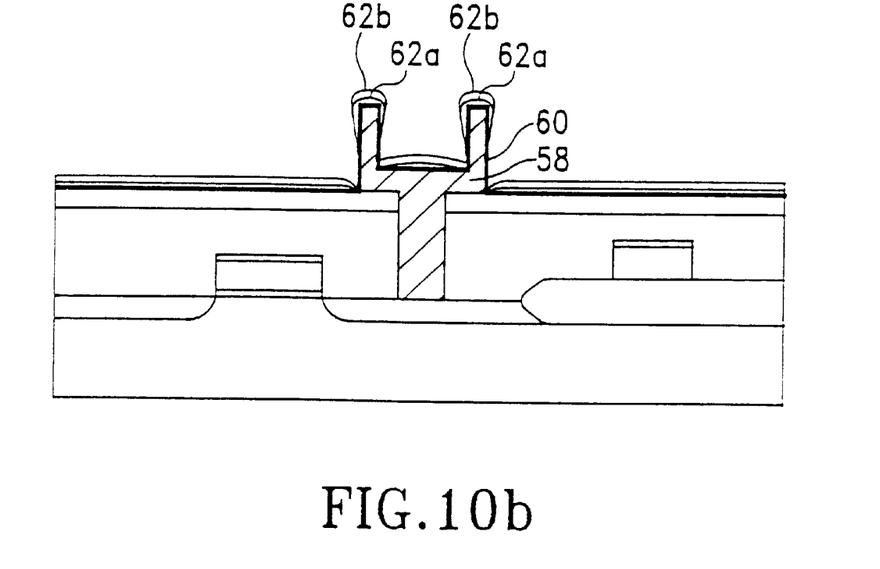
FIG. 10b is a cross section view of semiconductor wafer illustrating the step of forming a second TiN layer in accordance with the present invention.

Turning to FIG. 10a, a first titanium nitride(TiN) layer 62a is deposited by sputtering with thickness about 150 to 400 angstroms. The sputtering process can cover a thin layer of low-resistance TiN on most flat area. The following step is forming a second titanium nitride(TiN) layer 62b on the first TiN layer 62a by collimated-sputtering method, as shown in FIG. 10b. In this embodiment, the collimated-sputtering process can enhance the titanium nitride(TiN) formation on the bottom of deep small holes. The sequence of sputtered-TiN and collimated-sputtering TiN process can be reversed.

Figure 10C:
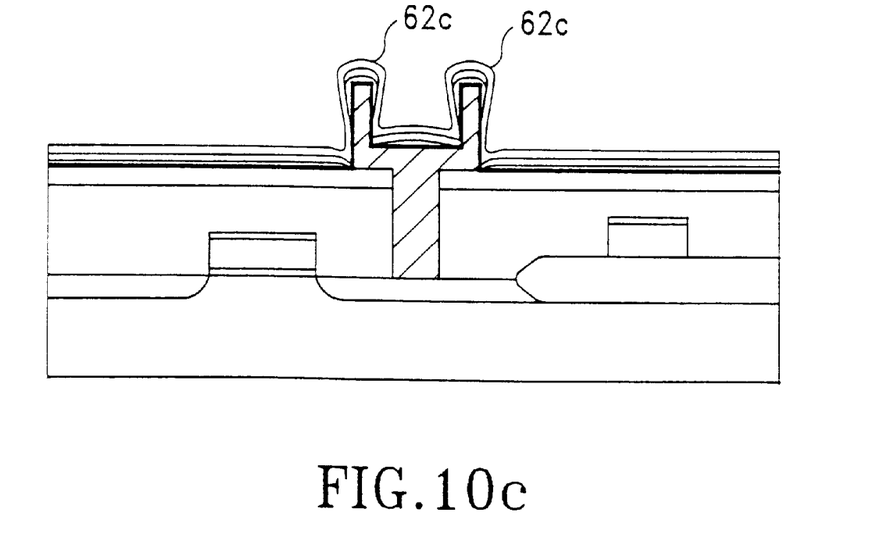
FIG. 10c is a cross section view of semiconductor wafer illustrating the step of forming a third TiN layer in accordance with the present invention.

Next, referring to FIG. 10c, a third titanium nitride(TiN) layer 62c is deposited on the second TiN layer 62b by conventional CVD or MOCVD method with thickness about 150 to 400 angstroms. In this embodiment, the CVD or MOCVD process can cover the whole surface with a thin TiN layer to prevent any electrode open due to its good step coverage. Additionally, the possibility of carbon contamination or the impact of Cl and F species on $Ta_2O_5$ due to the MOCVD process can be significantly reduced because the exist of pre-grown sputtered-TiN layers.

The processes of this invention can be used for Capacitor On Bit line(COB), stacked, hemispherical-grained(HSG) silicon, and etch-back-HSG DRAM capacitors.

Figure 11:
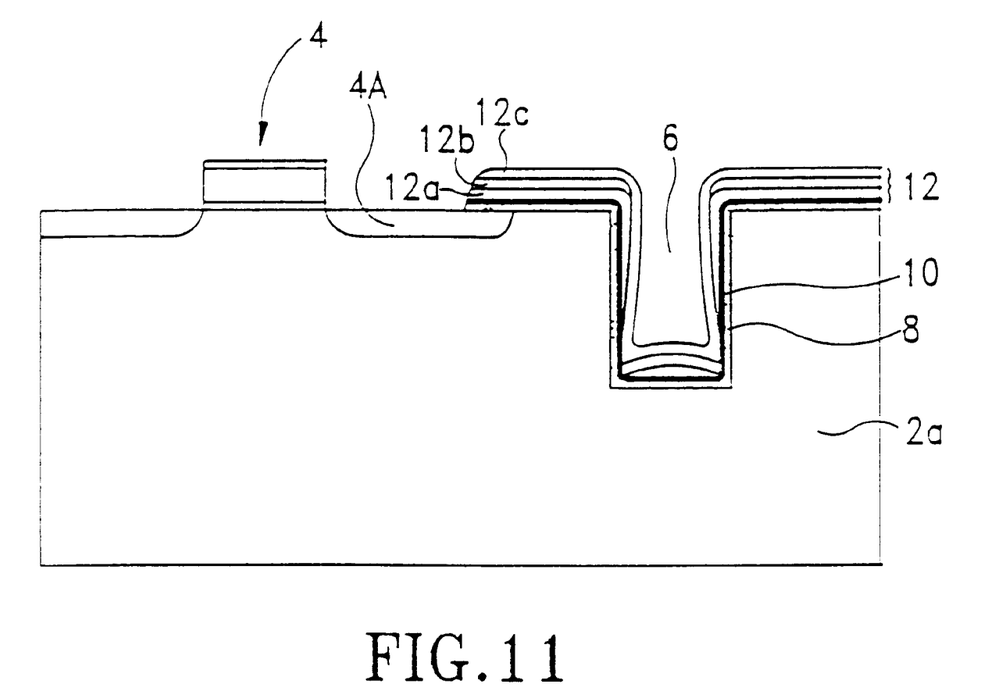
FIG. 11 is a cross section view of semiconductor wafer illustrating the result structure of the second preferred embodiment.

Another preferred embodiment of this invention also can be used in trench structure capacitor of DRAM cell, the final structure is shown in FIG. 11. The method of fabricating a trench-capacitor DRAM cell is described by following process. A n-typed MOSFET 4 is formed on a p-type substrate 2a, and a photoresist layer is patterned to expose a portion of the substrate layer 2a besides the source area 4A of MOSFET 4 and define a trench-capacitor area. The next step is using the photoresist layer as a mask and anisotropically etching the substrate 2a to form a trench 6. After the above processes a relatively doped polysilicon layer 8 is formed on the surface of the trench 6 and contacted to the source area 4A of MOSFET 4 as a bottom electrode of capacitor, a high dielectric film 10, for example, such as tantalum oxide ($Ta_2O_5$), BST, or PZT is deposited along the surface of the bottom electrode of the DRAM cell capacitor. A conductive layer 12 is deposited finally over the dielectric film. The conductive layer 12 is used as the top storage node and is formed of titanium nitride(TiN). In this preferred embodiment, the method of forming the top storage node on $Ta_2O_5$ dielectric layer 10, including following steps, first sputtering a first TiN 12a layer over the bottom electrode of capacitor, second collimated-sputtering a second TiN layer 12b on the first TiN layer 12a, and third CVD-deposited a third TiN layer 12c on the second TiN 12b layer. Additionally, as mentioned above, the sputtering-TiN process and collimated-sputtering TiN process sequence can be reversed.

The advantage of this invention is list as follows: (1) sputtered-TiN and collimated-sputtering TiN protect $Ta_2O_5$ from C, Cl, F contamination during CVD-TiN deposition; (2) CVD-TiN forms conformal TiN layer and prevents electrode open; (3) collimated-sputtering TiN enhances TiN deposition on trench bottom; and (4) this invention could be used for COB, stacked, HSG, HSG-etch-back capacitor structures.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a capacitor used in an integrated circuit, the method comprising the steps of:
   forming a first polysilicon layer over a substrate;
   forming an oxide layer on said first polysilicon layer;
   forming a photoresist layer on said oxide layer;
   etching said oxide layer by using said photoresist layer as a mask;
   etching said first polysilicon layer by using said etched oxide layer and said photoresist layer (serve) as a mask;
   forming a second polysilicon layer on said etched oxide layer;
   forming polysilicon side wall spacers on the side wall of said etched oxide layer;
   etching said oxide layer, thereby forming a bottom electrode of said capacitor;
   forming a dielectric film on (the surface of) said bottom electrode of said capacitor;
   forming a first conductive layer over said dielectric film said first conductive layer serving as a part of a top electrode of said capacitor;
   forming a second conductive layer over said first conductive layer, said second conductive layer serving as a part of said top electrode of said capacitor; and forming a third conductive layer over said second conductive layer, said third conductive layer serving as a part of said top electrode of said capacitor.

2. The method of claim 1, wherein the resistivity of said first polysilicon layer is about 35 ohm/square, and the dopant is phosphorus.

3. The method of claim 1, wherein the thickness of said first polysilicon layer is about 3000 angstroms.

4. The method of claim 1, wherein said bottom electrode has a cross section view of "U shape".

5. The method of claim 1, wherein said dielectric film is formed of tantalum oxide($Ta_2O_5$).

6. The method of claim 1, wherein said dielectric film is formed of a triple film of oxide/nitride/oxide.

7. The method of claim 1, wherein said dielectric film is formed of a double film of nitride/oxide film.

8. The method of claim 1, wherein said first conductive layer is formed of titanium nitride(TiN).

9. The method of claim 8, wherein said first conductive layer is formed by sputtering.

10. The method of claim 1, wherein said second conductive layer is formed of titanium nitride(TiN).

11. The method of claim 10, wherein said second conductive layer is formed by collimated-sputtering.

12. The method of claim 1, wherein said third conductive layer is formed of titanium nitride(TiN).

13. The method of claim 12, wherein said third conductive layer is formed by chemical vapor deposition.

14. The method of claim 8, wherein said first conductive layer is formed by collimated-sputtering.

15. The method of claim 10, wherein said second conductive layer is formed by sputtering.

16. A method for manufacturing a capacitor used in an integrated circuit, the method comprising the steps of:
   patterning a photoresist layer on a substrate to define a trench region with said substrate;
   etching said substrate to form a trench therein;
   forming a doped polysilicon layer on the surface of said trench;
   forming a tantalum oxide($Ta_2O_5$) layer on said doped polysilicon layer;
   forming a first titanium nitride(TiN) layer over said tantalum oxide($Ta_2O_5$) layer;
   forming a second titanium nitride(TiN) layer over said first titanium nitride(TiN) layer; and
   forming a third titaninm nitride(TiN) layer over said second titanium nitride layer by using chemical vapor deposition.

17. The method of claim 16, wherein said first titanium nitride(TiN) layer is formed by sputtering.

18. The method of claim 16, wherein said second titanium nitride(TiN) layer is formed by collimated-sputtering.

19. The method of claim 16, wherein said first titanium nitride(TiN) layer is formed by collimated-sputtering .

20. The method of claim 16, wherein said second titanium nitride(TiN) layer is formed by sputtering.

* * * * *